United States Patent
Jia et al.

(10) Patent No.: US 12,431,368 B2
(45) Date of Patent: Sep. 30, 2025

(54) SEMICONDUCTOR HEAT TREATMENT DEVICE AND METHOD FOR CONTROLLING PRESSURE IN PROCESS CHAMBER

(71) Applicant: BEIJING NAURA MICROELECTRONICS EQUIPMENT CO., LTD., Beijing (CN)

(72) Inventors: Yan Jia, Beijing (CN); Dan Geng, Beijing (CN); Zhimin Chen, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 18 days.

(21) Appl. No.: 18/686,651

(22) PCT Filed: Aug. 22, 2022

(86) PCT No.: PCT/CN2022/113832
§ 371 (c)(1),
(2) Date: Feb. 26, 2024

(87) PCT Pub. No.: WO2023/025076
PCT Pub. Date: Mar. 2, 2023

(65) Prior Publication Data
US 2024/0355646 A1    Oct. 24, 2024

(30) Foreign Application Priority Data
Aug. 27, 2021   (CN) .......................... 202110998436.4

(51) Int. Cl.
*H01L 21/67* (2006.01)
*G05D 16/16* (2006.01)

(52) U.S. Cl.
CPC ....... *H01L 21/67017* (2013.01); *G05D 16/16* (2013.01); *H01L 21/67098* (2013.01)

(58) Field of Classification Search
CPC ................ G05D 16/16; G05D 16/2013; H01L 21/67017; H01L 21/67098; H01L 21/67253
See application file for complete search history.

(56) References Cited

U.S. PATENT DOCUMENTS 7,972,649 B2 *   7/2011   Hirata ................. C23C 16/4412
                                                   427/255.28
9,075,414 B2 *   7/2015   Takijiri ................. G05D 7/0635
(Continued)

FOREIGN PATENT DOCUMENTS

CN          107475693 A      12/2017
CN          111081592 A      4/2020
(Continued)

OTHER PUBLICATIONS

The World Intellectual Property Organization (WIPO) International Search Report for PCT/CN2022/113832 Oct. 10, 2022 7 Pages (including translation).

*Primary Examiner* — Eric Keasel
(74) *Attorney, Agent, or Firm* — ANOVA LAW GROUP, PLLC

(57) ABSTRACT

A method of controlling a pressure in a process chamber of a semiconductor heat treatment device includes: obtaining an actual pressure value in the process chamber; determining a first valve opening value for controlling opening an exhaust valve according to a difference between the actual pressure value and a preset target pressure value; determining a first valve opening change value according to the first valve opening value and a current valve opening value; determining whether the first valve opening change value is within a preset fluctuation range of a valve opening change (Continued)

value corresponding to a current process stage; and in response to the first valve opening change value being within the fluctuation range, adjusting opening of an exhaust valve according to the first valve opening value.

10 Claims, 5 Drawing Sheets

(56) References Cited

U.S. PATENT DOCUMENTS

| | | | |
|---|---|---|---|
| 10,054,959 B2 * | 8/2018 | Somani | G01F 15/005 |
| 10,211,110 B1 * | 2/2019 | Kamakura | H01L 21/67017 |
| 2014/0007950 A1 | 1/2014 | Takijiri | |

FOREIGN PATENT DOCUMENTS

| | | |
|---|---|---|
| CN | 112359423 A | 2/2021 |
| CN | 113699590 A | 11/2021 |
| JP | H1063345 A | 3/1998 |
| JP | 2008072030 A | 3/2008 |
| JP | 2017156069 A | 9/2017 |
| JP | 6681452 B1 | 4/2020 |
| WO | 2021060140 A1 | 4/2021 |

* cited by examiner

SEMICONDUCTOR HEAT TREATMENT DEVICE AND METHOD FOR CONTROLLING PRESSURE IN PROCESS CHAMBER

CROSS-REFERENCE TO RELATED APPLICATIONS

This application is a national phase entry of PCT Patent Application No. PCT/CN2022/113832, filed on Aug. 22, 2022, which claims the priority of Chinese Patent Application No. 202110998436.4, filed on Aug. 27, 2021, the entire contents of all of which are incorporated herein by reference.

TECHNICAL FIELD

The present disclosure relates to the technical field of semiconductor processing technology and, more particularly, to a semiconductor heat treatment device and a method for controlling pressure in a process chamber.

BACKGROUND

A semiconductor heat treatment device, e.g., a vertical furnace device or a horizontal furnace device, often includes a process chamber. The pressure inside the process chamber needs to be strictly controlled during a semiconductor processing process. Fluctuations of the pressure inside the process chamber may cause irregular molecular movements in the internal environment of the process chamber, which may in turn affect uniform distribution of molecules on a wafer (e.g., a silicon wafer), thereby resulting in uneven film thickness and ultimately lowering product yield.

In the related art, a relative pressure control method is used to control the pressure inside the process chamber. That is, the degree of opening of a valve is controlled based on a difference between the pressure inside the process chamber and an external environment pressure, thereby controlling the pressure inside the process chamber. Because the external environment pressure is affected by regional location differences and regional temperature differences, controlling the pressure inside the process chamber through a relative pressure cannot sufficiently satisfy accuracy requirements for diffusion processes of the semiconductor heat treatment device. To avoid the external environment pressure fluctuation affecting pressure control accuracy in the semiconduction heat treatment process, related technologies also use absolute pressure control methods to control the pressure inside the process chamber, that is, using "0" as the reference point to control the pressure inside the process chamber. However, the environment inside the process chamber is often subject to complex changes. Furthermore, during the switching of different process stages, the pressure inside the process chamber fluctuates substantially, which can easily cause the semiconductor heat treatment device to shut down as a result of the pressure alarm being triggered.

SUMMARY

The present disclosure provides a semiconductor heat treatment device and a method of controlling a pressure in a process chamber to solve the problem of substantial pressure fluctuation in the process chamber of the semiconductor heat treatment device.

One aspect of the present disclosure provides a method of controlling a pressure in a process chamber of a semiconductor heat treatment device. The method includes: obtaining an actual pressure value in the process chamber; determining a first valve opening value for controlling opening an exhaust valve according to a difference between the actual pressure value and a preset target pressure value; determining a first valve opening change value according to the first valve opening value and a current valve opening value; determining whether the first valve opening change value is within a preset fluctuation range of a valve opening change value corresponding to a current process stage; and in response to the first valve opening change value being within the fluctuation range, adjusting opening of an exhaust valve according to the first valve opening value.

Another aspect of the present disclosure provides a semiconductor heat treatment device. The device includes a process chamber, an exhaust valve, a pressure sensor, and a control unit. The exhaust valve is disposed at an exhaust pipeline in the process chamber. The pressure sensor is configured to obtain an actual pressure value in the process chamber. The control unit is configured to determine a first valve opening value for controlling opening an exhaust valve according to a difference between the actual pressure value and a preset target pressure value; determine a first valve opening change value according to the first valve opening value and a current valve opening value; determine whether the first valve opening change value is within a preset fluctuation range of a valve opening change value corresponding to a current process stage; and in response to the first valve opening change value being within the fluctuation range, adjust opening of an exhaust valve according to the first valve opening value.

The technical solution of the present disclosure provides the following beneficial effects.

In the control method disclosed in the embodiments of the present disclosure, the actual pressure value in the process chamber is obtained. The first valve opening value for controlling the valve opening is obtained based on the obtained actual pressure value and the preset target pressure value, to form the primary control loop for controlling the valve opening.

The valve opening change value is determined based on the first valve opening value and the current valve opening value. Whether to send the first valve opening value to the exhaust valve is determined according to whether the valve opening change value is within the fluctuation range of the valve opening change value, and then the secondary control loop for controlling the valve opening command signal as the control object is formed. This solution uses the primary control loop to control the pressure in the process chamber, and the secondary control loop to follow-up control the valve opening, such that the exhaust valve can respond more quickly to the interference signal of the pressure in the process chamber. At the same time, the first valve opening value output by the primary control loop is filtered through the secondary control loop, which reduces the pressure fluctuation in the process chamber.

BRIEF DESCRIPTION OF THE DRAWINGS

The drawings described here are used to provide a further understanding of the present disclosure and constitute a part of the present disclosure. The embodiments of the present disclosure and the descriptions thereof are used to explain the present disclosure and do not constitute an improper limitation of the present disclosure. The drawings are briefly described below.

Figure 1:
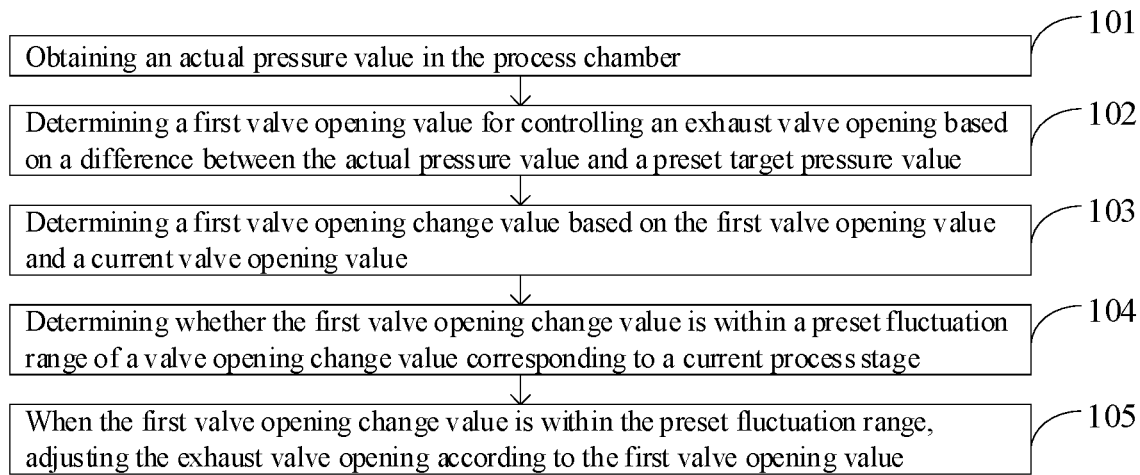
FIG. 1 is a flowchart of an exemplary method of controlling pressure in a process chamber of a semiconductor heat treatment device according to some embodiments of the present disclosure.
Figure 2:
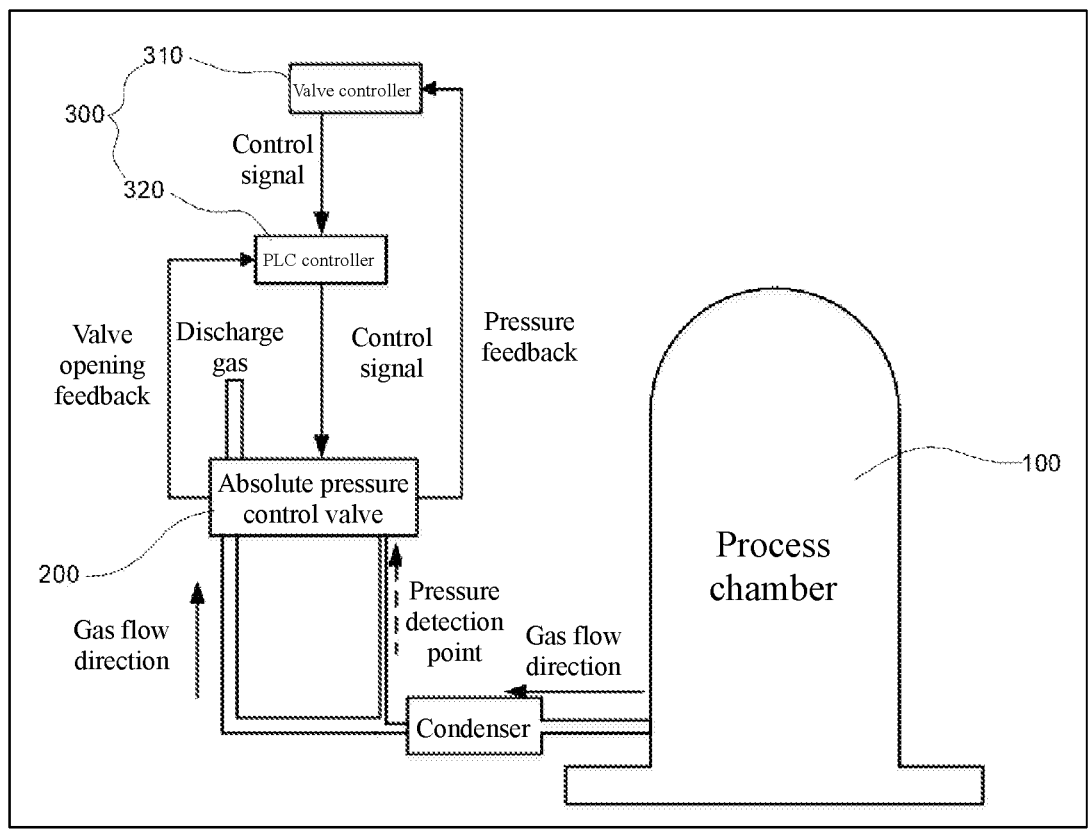
FIG. 2 is a schematic diagram showing operation principle of an exemplary method of controlling pressure in a process chamber of a semiconductor heat treatment device according to some embodiments of the present disclosure.
Figure 3:
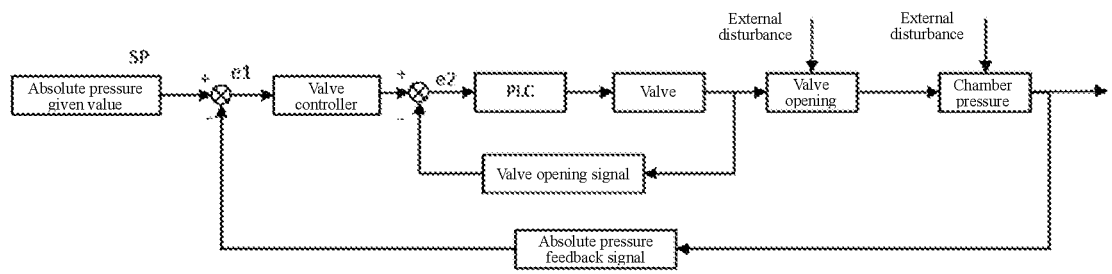
FIG. 3 is a control diagram of an exemplary method of controlling pressure in a process chamber of a semiconductor heat treatment device according to some embodiments of the present disclosure.
Figure 4:
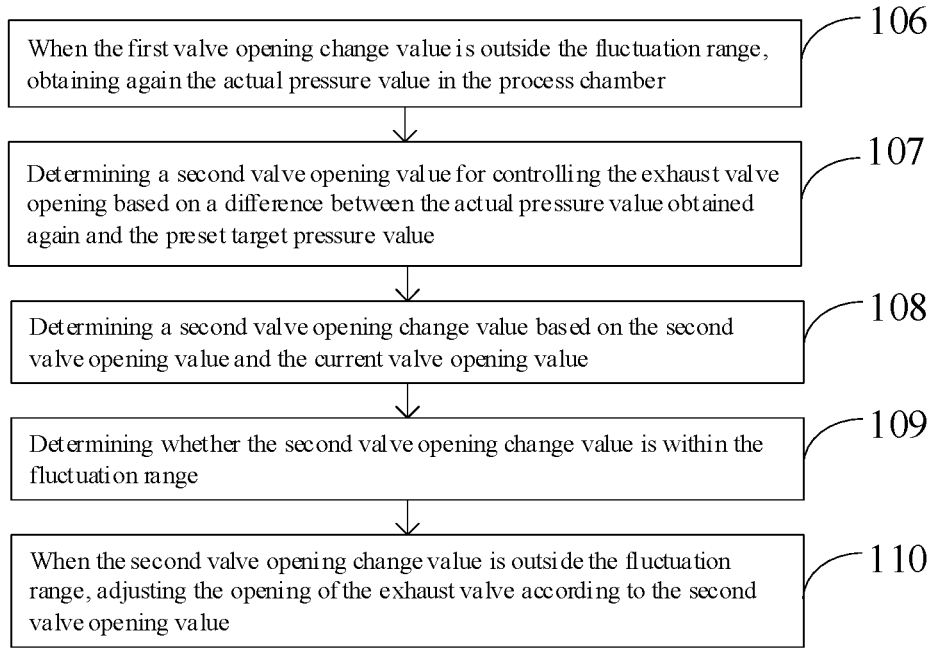
FIG. 4 is a flowchart of an exemplary method of controlling pressure in a process chamber of a semiconductor heat treatment device after 110 according to some embodiments of the present disclosure.
Figure 5:
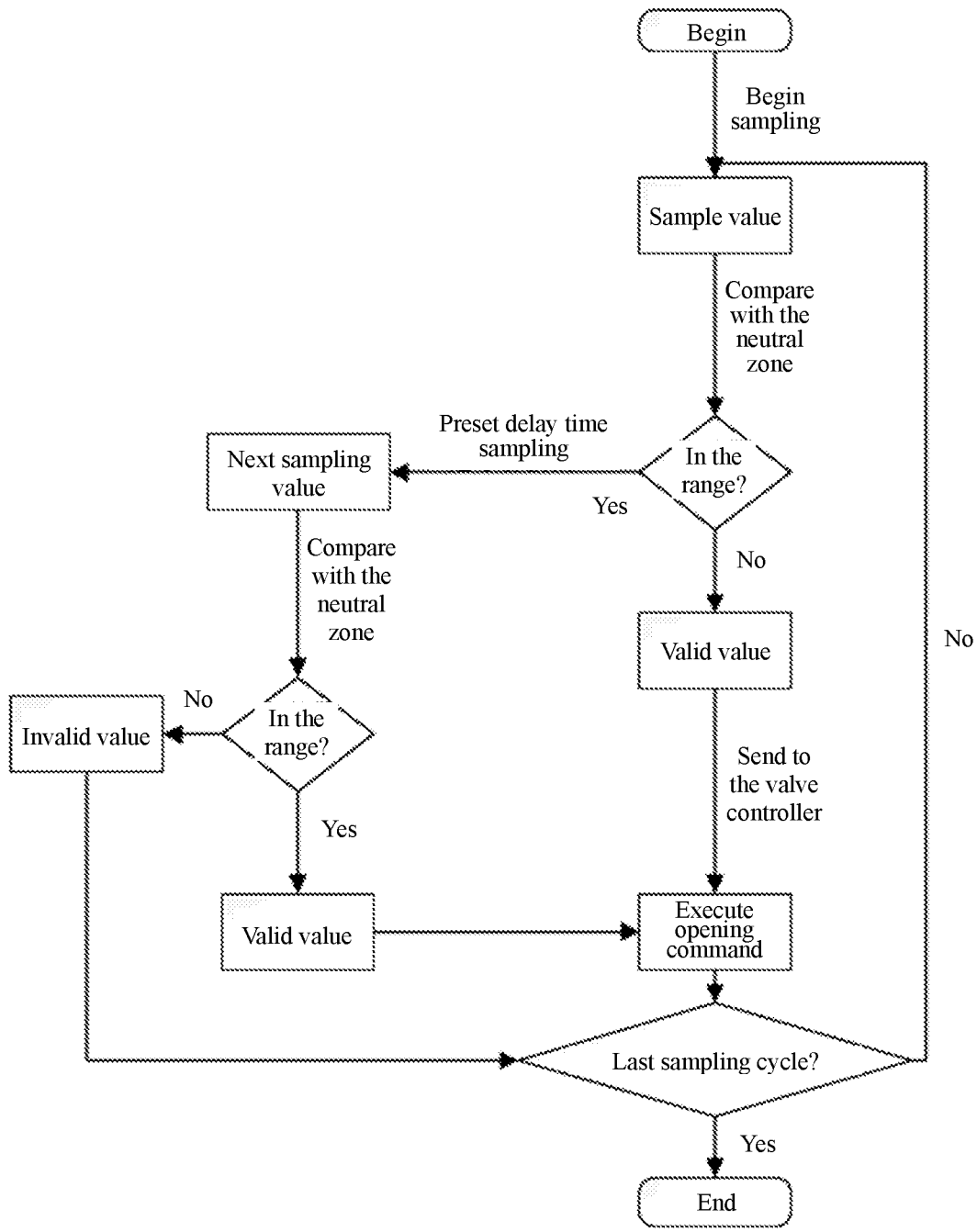
FIG. 5 is a flowchart of determining an effective value of a valve opening command signal according to some embodiments of the present disclosure.

The numeral labels in the drawings include 100 process chamber, 200 exhaust valve, 300 control unit, 310 first controller, and 320 second controller.

DETAILED DESCRIPTION OF THE EMBODIMENTS

To make the objectives, technical solutions, and advantages of the present disclosure clearer, the technical solutions of the present disclosure will be clearly and completely described below with reference to various embodiments of the present disclosure and corresponding drawings. Obviously, the described embodiments are merely some of the embodiments of the present disclosure, but not all of the embodiments. Based on the embodiments of the present disclosure, all other embodiments obtained by those of ordinary skill in the art without creative efforts fall within the scope of the present disclosure.

The technical solutions disclosed in various embodiments of the present disclosure will be described in detail below with reference to FIGS. 1 to 8.

Referring to FIGS. 1 to 5, the present disclosure provides a method of controlling pressure in a process chamber of a semiconductor thermal treatment device. The method includes the following processes.

At 101, an actual pressure value in the process chamber is obtained.

At 102, a first valve opening value for controlling an exhaust valve opening is determined based on a difference between the actual pressure value and a preset target pressure value.

At 103, a first valve opening change value is determined based on the first valve opening value and a current valve opening value.

At 104, whether the first valve opening change value is within a preset fluctuation range of a valve opening change value corresponding to a current process stage is determined.

At 105, when the first valve opening change value is within the preset fluctuation range, the exhaust valve opening is adjusted according to the first valve opening value.

In semiconductor processing processes, different processes correspond to different pressure variation ranges in process chamber 100. An exhaust valve 200 is one of the components for regulating the pressure in process chamber 100. By adjusting an opening of the exhaust valve 200, a rate at which a gas is discharged from the process chamber 100 can be adjusted, thereby adjusting the pressure of the process chamber 100. As such, when a gas intake rate of the process chamber 100 is constant, the greater the opening of the exhaust valve 200, the greater the rate of the gas discharged from the process chamber 100, and thus the smaller the pressure in the process chamber 100 is. The smaller the opening of the exhaust valve 200 is, the smaller the rate at which the gas is discharged from the process chamber 100, and thus the greater the pressure in the process chamber 100 is. Therefore, the greater the valve opening change value of the exhaust valve 200 is, the greater the pressure fluctuation in process chamber 100 is. The smaller the valve opening change value of the exhaust valve 200 is, the smaller the pressure fluctuation in process chamber 100 is. Furthermore, a fluctuation range of the pressure in process chamber 100 can be controlled by controlling a fluctuation range of the valve opening change value. The valve opening change value refers to an increase or decrease in the opening of the exhaust valve 200 before and after adjusting the opening of the exhaust valve 200. The fluctuation range of the valve opening change value refers to a fluctuation range of the valve opening change value of the exhaust valve 200 during the process of adjusting the exhaust valve 200.

In some embodiments, the control method is particularly suitable for controlling an absolute pressure. The absolute pressure in process chamber 100 is obtained, that is, a reference value of the obtained pressure is a fixed value. For example, the reference value for obtaining the pressure in the process chamber 100 is "0". Compared with the relative pressure control method, using the absolute pressure to control the pressure in process chamber 100 prevents environmental changes from affecting pressure changes in the process chamber 100. For example, a pressure sensor is installed in process chamber 100, and the pressure sensor is used to sense the absolute pressure in the process chamber 100. First pressure information is obtained by the pressure sensor, such that an actual pressure value in the process chamber 100 can be obtained. In some embodiments, the pressure sensor may be an absolute pressure sensor. For example, the actual pressure value in process chamber 100 is transmitted in the form of an analog signal, which can be a current level, a resistance level, a voltage level, etc., which is not limited in the present disclosure.

For example, a valve controller may be used to convert the actual pressure value and the preset target pressure value into the first valve opening value that controls the opening of the exhaust valve. The preset target pressure value is related to the semiconductor process. Specifically, a target pressure value may be set according to the requirements of the semiconductor process. For example, when the target pressure values required by each process stage are different, multiple target pressure values may be set according to the requirements of each process stage.

For example, the current valve opening value may be obtained through a sensor. Of course, the current valve opening value may also be obtained by reading stored control information that controlled the valve opening last time. As such, the present disclosure does not limit the specific method of obtaining valve opening information. For example, a difference between the first valve opening value and the current valve opening value may be used as the first valve opening change value.

In some embodiments, the actual pressure value in the process chamber 100 is obtained, and the first valve opening value for controlling valve opening is obtained by processing the actual pressure value and the preset target pressure value to form a primary control loop for controlling the absolute pressure value in the process chamber 100 as a control object. Thus, internal and external environments of process chamber 100 can be prevented from affecting the pressure value in the process chamber 100. For example, the first valve opening value is a valve opening command signal. In some embodiments, by configuring a secondary control loop for controlling a valve opening command signal as a control object, disturbances in the process chamber 100 can be prevented minimized from affecting the pressure control in the process chamber 101. For example, the first valve opening value obtained by the primary control loop may be used as a given value of the secondary control loop, and the current valve opening value obtained may be used as feedback information of the secondary control loop. For example, the secondary control loop may use a control unit to determine whether to send the first valve opening value output by the primary control loop to the exhaust valve based on the first valve opening value, the current valve opening value, and the fluctuation range of the valve opening change value corresponding to the current process stage, thereby forming a dual-loop control system including the primary control loop for controlling the process chamber 100 as the control object and the secondary control loop for controlling a valve opening signal as the control object. The first valve opening value that controls the valve opening in the primary control loop is the control object in the secondary control loop. Because the secondary control loop is a closed loop that is not subject to external disturbances, in the event of external disturbances, the secondary control loop can filter out invalid data with large fluctuations in the first valve opening value. Thus, the first valve opening value sent to the exhaust valve will not cause obvious oscillation as the pressure in the process chamber 100 fluctuates. When disturbance occurs, hysteresis of valve action and instability of the process operation are reduced.

The first valve opening value is obtained through the first pressure information and the preset target pressure value, thereby making the first valve opening value follow with respect to the pressure in process chamber 100. That is, the first valve opening value varies with the pressure in process chamber 100. Therefore, when the pressure in the process chamber 100 is disturbed and fluctuates, the first valve opening value will also fluctuate accordingly. That is, when the pressure in the process chamber 100 is disturbed and fluctuates, the first valve opening value is an unstable oscillation value. In the embodiments of the present disclosure, the secondary control loop filters out the first valve opening value that will cause the valve opening change value to exceed the fluctuation range of the valve opening change value required in the current process stage, thereby reducing the fluctuation of the pressure in the process chamber 100.

If the first valve opening change value corresponding to a command signal to control the valve opening exceeds the fluctuation range of the valve opening change value corresponding to the current process stage, the first valve opening value corresponding to the command signal to control the valve opening is located in a neutral zone. If the first valve opening value is outside the neutral zone, the first valve opening value is a valid value. If the first valve opening value is within the neutral zone, the first valve opening value is an invalid value. For example, referring to FIG. 5, when the first valve opening value is outside the neutral zone, that is, the first valve opening change value corresponding to the first valve opening value is within the fluctuation range of the valve opening change value corresponding to the current process stage, a controller can adjust the valve opening according to the first valve opening value.

It should be noted that the first valve opening change value corresponding to the first valve opening value is the first valve opening change value determined at 103 by the first valve opening value.

In some embodiments, the control method may include the following processes.

At 106, when the first valve opening change value is outside the fluctuation range, the actual pressure value in the process chamber is obtained again.

At 107, a second valve opening value for controlling the exhaust valve opening is determined based on a difference between the actual pressure value obtained again and the preset target pressure value.

At 108, a second valve opening change value is determined based on the second valve opening value and the current valve opening value.

At 109, whether the second valve opening change value is within the fluctuation range is determined.

At 110, when the second valve opening change value is outside the fluctuation range, the opening of the exhaust valve is adjusted according to the second valve opening value.

In some embodiments, the actual pressure value in the process chamber 100 is obtained again, and the actual pressure value in the process chamber 100 obtained again is the given value in 107, such that peak data can be filtered out through steps 107 to 110.

For example, when the first valve opening value is within the neutral zone, the first valve opening value is an invalid value. That is, the first valve opening change value is outside the fluctuation range. Thus, the actual pressure in the process chamber can be obtained again. The control unit determines the second valve opening value based on the difference between the actual pressure obtained again and the preset target pressure value. For example, the control unit may be a valve controller.

In some embodiments, when the first valve opening value is within the neutral zone, the actual pressure in the process chamber 100 is obtained again to obtain the second valve opening value. It is determined whether to control the opening of the exhaust valve according to the second valve opening value by determining whether the second valve opening value is located in the neutral zone. If the second valve opening value is outside the neutral zone, the second valve opening value is an invalid value. If the second valve opening value is within the neutral zone, the second valve opening value is a valid value. For example, when the second valve opening value is within the neutral zone, the second valve opening value is a valid value. That is, the second valve opening change value corresponding to the second valve opening value is outside the fluctuation range. The controller unit may adjust the opening of the exhaust valve according to the second valve opening value. The present disclosure can not only filter out the peak data of the pressure fluctuations in the process chamber 100, but also prevent the semiconductor heat treatment device from being shut down due to excessive pressure fluctuations.

It should be noted that long lasting pressure fluctuations in the process chamber 100 will trigger an alarm in the pressure control system of the semiconductor heat treatment device, thereby causing the semiconductor heat treatment device to be shut down. For example, a duration during which the pressure in the process chamber 100 exceeds the pressure range required by the process is a first time period, and a delay time of a pressure alarm set by the process is a second time period. When the first time period is greater than the second time period, a pressure control system alarm will be triggered, thereby causing the semiconductor heat treatment device to be shut down. For example, the delay time of the pressure alarm set by the process is about 50 ms. If the pressure in the process chamber 100 exceeds the pressure range required by the process for more than 50 ms, the pressure control system alarm will be triggered, thereby causing shutdown of semiconductor heat treatment device.

In some embodiments, at 103, before determining the first valve opening change value based on the first valve opening value and the current valve opening value, the control method may further include the following process.

At 111, a filtering process is performed on the first valve opening value.

For example, the control unit may perform the filtering process on the first valve opening value to reduce the follow-up of the first valve opening value. In some embodiments, the control unit filters the first valve opening value, and uses the filtered first valve opening value as the given value of the secondary control loop, which can further prevent the semiconductor heat treatment device from being shut down due to a long period of the pressure fluctuation.

In some embodiments, at 108, before determining the second valve opening change value based on the second valve opening value and the current valve opening value, the control method further includes the following process.

At 112, a filtering process is performed on the second valve opening value.

For example, the control unit may perform the filtering processing on the second valve opening value to reduce the follow-up of the second valve opening value. In some embodiments, the second valve opening value is filtered by the control unit, and the filtered second valve opening value is used as the given value of the secondary control loop, which can further prevent the semiconductor heat treatment device from being shut down due to long period of the pressure fluctuation.

Figure 7:
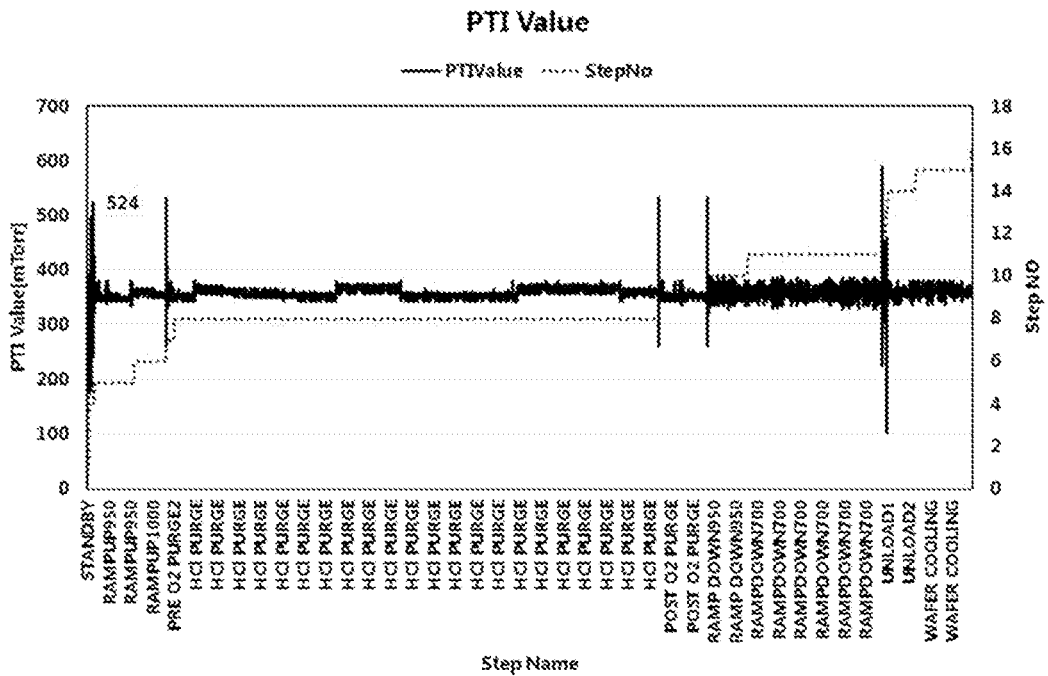
FIG. 7 is a real-time curve of the pressure in the process chamber during a hydrogen chloride purging process using a single loop pressure control method in the process chamber according to some embodiments of the present disclosure.

FIG. 7 is a real-time curve of the pressure in the process chamber during a hydrogen chloride purging process (TLC purge) using a single loop pressure control method in the process chamber according to some embodiments of the present disclosure. The horizontal axis is a complete stage from the beginning to the end of the process, and the vertical axis is the pressure value (mTorr). For example, the preset pressure is 375 mTorr. The solid line is the actual pressure in the process chamber, and the dotted line is a process curve. As shown in FIG. 7, except for the beginning of the process, there are several obvious fluctuations during the process. The maximum fluctuation occurs at the moment when the process chamber cools down to 700° C. (Ramp-Down700) and the quartz boat starts to descend (Unload2). The maximum value is close to 600 mTorr, the minimum value is close to 100 mTorr, and the fluctuation exceeds 50%. If the disturbance is too severe, for example, the duration during which the pressure in the process chamber 100 exceeds the pressure range required by the process is the first time period, and the delay time of the pressure alarm set by the process is the second time period. When the first time period exceeds the second time period, the pressure control system alarm will be triggered, thereby causing the semiconductor heat treatment device to be shut down.

In some embodiments, the control method further includes the following process.

At 113, if the second valve opening change value is within the fluctuation range, the second valve opening value is abandoned, and the actual pressure value in the process chamber is obtained again, that is, return to 101.

In some embodiments, when the first valve opening change value is outside the fluctuation range, the process is paused for a preset time period before performing obtaining the actual pressure in the process chamber again, that is, 106.

For example, the preset time period is greater than zero. In some embodiments, the preset time period is less than the delay time of the pressure alarm of the semiconductor heat treatment device. For example, the first time period is 5 ms, and the delay time of the pressure alarm of the semiconductor heat treatment device is 50 ms.

In some embodiments, the number of process stages is multiple. Multiple fluctuation ranges are preset according to each process stage, and each fluctuation range corresponds to each process stage in a one-to-one correspondence.

The semiconductor processing process is a multiple-stage and complex reaction process, so that the pressure fluctuations of the process chamber 100 required in different process stages are different. For example, the semiconductor processing process includes multiple process stages, and the fluctuation ranges of the multiple valve opening change values are determined according to the pressure fluctuation ranges in the process chamber 100 required for each process stage. For example, the fluctuation range of the valve opening change value corresponding to each stage can be set according to the requirements of each process stage. Then, the fluctuation range of the valve opening change value corresponding to the process stage can be selected according to the current process stage as the criterion for determining the validity or invalidity of the first valve opening value and the second valve opening value. Thus, the secondary control loop filters the invalid first valve opening value or the invalid second valve opening value to avoid data distortion.

Figure 6:
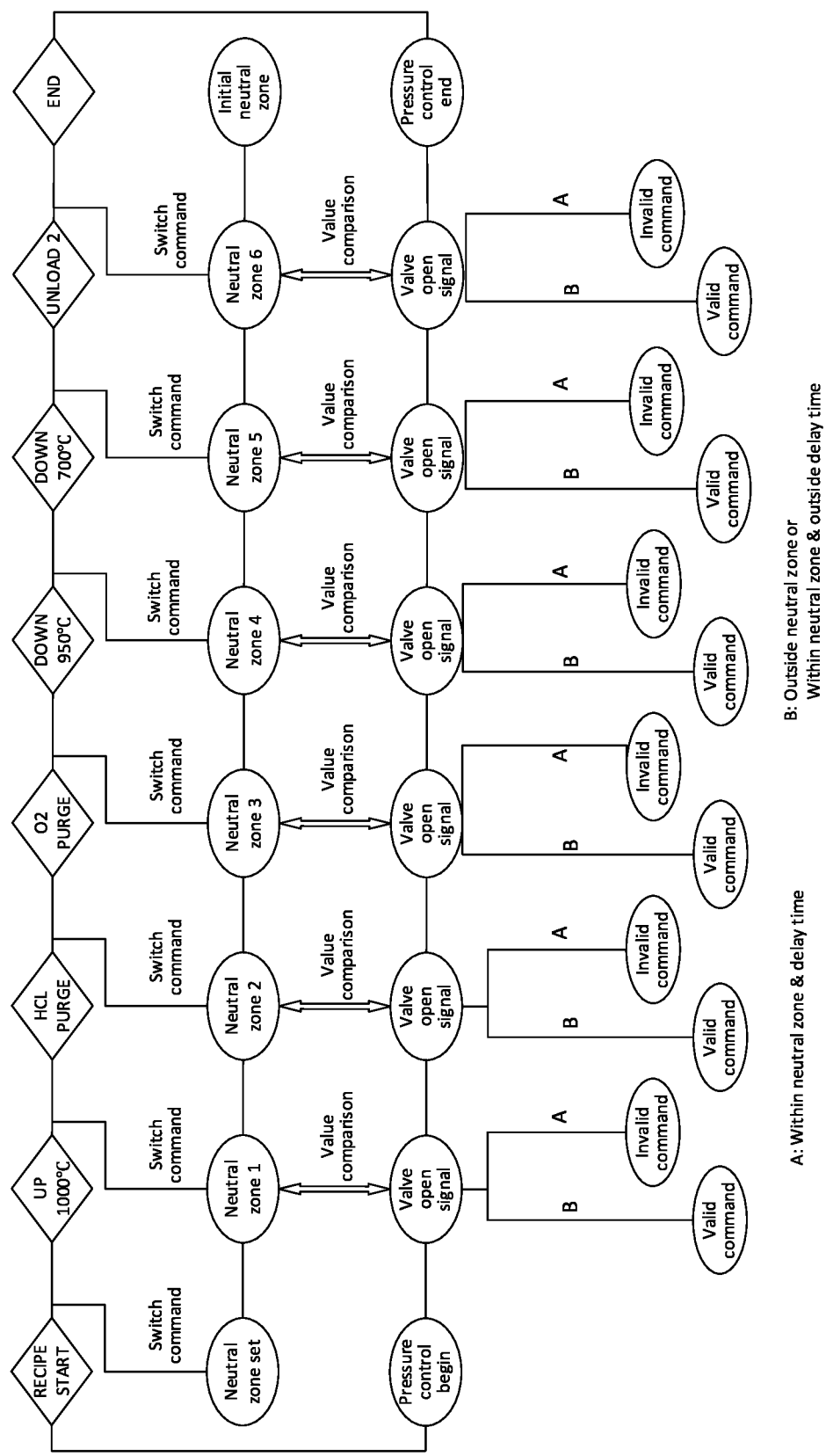
FIG. 6 is a schematic diagram showing an exemplary control method including multiple process stages according to some embodiments of the present disclosure.

Referring to FIG. 6, multiple neutral zones may be determined according to each fluctuation range to determine the validity of the first valve opening value and/or the second valve opening value through the multiple neutral zones. Referring to FIG. 6, if the first valve opening value is outside the neutral zone, then the first valve opening value is a valid value. If the first valve opening value is within the neutral zone, then the first valve opening value is invalid value. If the second valve opening value is outside the neutral zone, the second valve opening value is an invalid value. If the second valve opening value is within the neutral zone, the second valve opening value is a valid value.

In some embodiments, the control method further includes the following process.

At 114, the fluctuation range of the valve opening change value corresponding to the process stage is switched.

For example, FIG. 6 is a control schematic diagram of trans dichlorethylene purge test (TLC purge) process. The TLC purge includes a total of six process stages. According to the needs of the six process stages, the fluctuation ranges of the six valve openings are set. For example, six fluctuation ranges of valve opening may form a fluctuation range set. When switching between two adjacent process stages, a unit used to control the process switching can send an instruction for switching the fluctuation range of the valve opening to the control unit that controls the switching of the fluctuation range of the valve opening, such that the control unit can search the fluctuation range set for a fluctuation range of the valve opening that is suitable for the process stage currently required to be switched, and apply the searched fluctuation range of the valve opening to 104 and/or 109.

Figure 8:
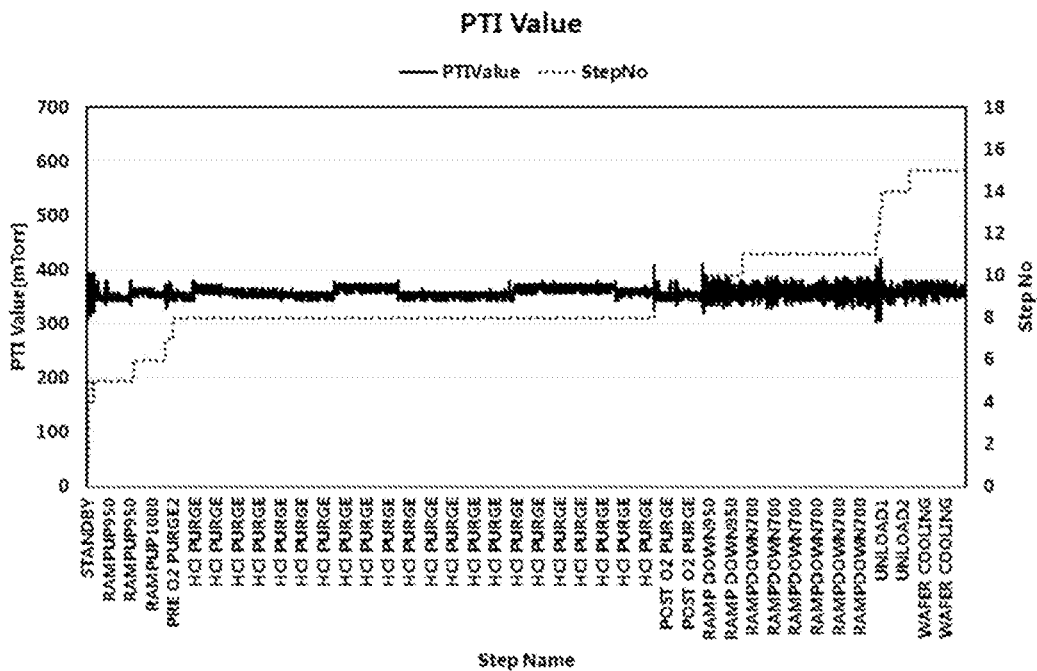
FIG. 8 is a real-time curve of the pressure in the process chamber during a hydrogen chloride purging process using an absolute pressure control method in the process chamber according to some embodiments of the present disclosure.

FIG. 8 is a real-time curve of the pressure in the process chamber during a hydrogen chloride purging process using an absolute pressure control method in the process chamber according to some embodiments of the present disclosure. As shown in FIG. 8, the pressure in the process chamber 100 is stable near the set value of 375 mTorr. There is no excessive pressure fluctuation at the moment when the process stage is switched. The maximum fluctuation occurs when the hydrogen chloride purge stage is switched to oxygen purge stage. The maximum value is close to 410 mTorr, the minimum value is close to 330 mTorr, and the fluctuation does not exceed 15%. Compared with the single-loop pressure control method used in related technologies, the absolute pressure control method in the process chamber described in the present disclosure improves the stability of the pressure in the process chamber 100, allows the process chamber 100 to respond quickly to external disturbances, and reduces the impact on the stability of the control system caused by the follow-up and hysteresis of the valve action relative to the control object.

Based on the method for controlling the absolute pressure in the process chamber disclosed in the embodiments of the present disclosure, the present disclosure also discloses a semiconductor heat treatment device. The semiconductor heat treatment device may be adapted to the method for controlling the absolute pressure in the process chamber disclosed in the embodiments of the present disclosure.

For example, the semiconductor heat treatment device includes a process chamber 100, an exhaust valve 200, a pressure sensor, and a control unit 300. A valve is provided in the process chamber 100, and the exhaust valve 200 is provided on an exhaust pipeline of the process chamber 100, for controlling the discharge rate of the process chamber 100. The pressure sensor is used to obtain the actual pressure value in the process chamber 100. The control unit 300 is configured to determine the first valve opening value for controlling the exhaust valve opening according to the difference between the actual pressure value and the preset target pressure value. The first valve opening change value is determined based on the first valve opening value and the current valve opening. Whether the first valve opening change value is within the preset fluctuation range of the valve opening change value corresponding to the current process stage is determined. When the first valve opening change value is within the fluctuation range, the exhaust valve is adjusted according to the first valve opening value.

For example, the pressure sensor may be an absolute pressure sensor to sense the absolute pressure value in the process chamber 100 through the pressure sensor.

In some embodiments, the control unit 300 includes a first controller 310 and a second controller 320. The first controller 310 is used to determine the first valve opening value for controlling the opening of the exhaust valve according to the difference between the actual pressure value and the preset target pressure value.

The second controller 320 is used to determine the first valve opening change value according to the first valve opening value and the current valve opening value; determine whether the first valve opening change value is within the preset fluctuation range of the valve opening change value corresponding to the current process stage; and when the first valve opening change value is within the fluctuation range, adjust the opening of the exhaust valve according to the first valve opening value.

In some embodiments, the first controller 310 is also used to obtain the actual pressure value in the process chamber obtained by the pressure sensor again when the first valve opening change value is outside the fluctuation range; and determine the second valve opening value for controlling the opening of the exhaust valve according to the difference between the actual pressure value obtained again and the preset target pressure value. The second controller 320 is also configured to determine the second valve opening change value based on the second valve opening value and the current valve opening value; and determine whether the second valve opening change value is within the fluctuation range. When the second valve opening change value is outside the fluctuation range, the opening of the exhaust valve is adjusted according to the second valve opening value.

Further, the second controller 320 is also used to abandon the second valve opening value when the second valve opening change value is outside the fluctuation range. The first controller 310 is also used to reobtain the actual pressure value in the process chamber obtained by the pressure sensor after the second controller 320 abandons the second valve opening value.

For example, the first controller 310 is connected to a pressure sensor, and the first controller 310 receives pressure information and obtains the first valve opening value based on the actual pressure value and the preset target pressure value. For example, the first controller 310 may be an analog-to-digital converter, such as a valve opening controller. The second controller 320 is connected to the first controller 310 and the exhaust valve 200 respectively. The second controller 320 adjusts the opening of the valve according to the first valve opening value and the fluctuation range of the valve opening change value corresponding to the current process stage. In some embodiments, the second controller may be a PLC controller.

In the semiconductor heat treatment device described above, the pressure sensor, the first controller 310, and the exhaust valve 200 form the primary control loop for controlling the valve opening as the control object. By obtaining the opening value of the valve, the second controller 320 forms the secondary control loop. Specifically, the first valve opening value obtained by the primary control loop is inputted to the second controller 320 as the given value of the secondary control loop. The second controller 320 performs the filtering process on the first valve opening value output by the first controller 310, that is, determining the validity of the first valve opening value, and sends the valid first valve opening value to the exhaust valve 200 to reduce the pressure fluctuation in the process chamber 100.

The embodiments of the present disclosure focus on the differences between various embodiments. As long as different optimization features between the various embodiments are not inconsistent, the optimization features can be combined to form another desired embodiment. For the brevity of the description, detail description is omitted herein.

The above descriptions are merely examples of the present disclosure and are not intended to limit the present disclosure. Various modifications and variations will occur to the present disclosure to those skilled in the art. Any modifications, equivalent substitutions, improvements, etc. made within the spirit and principles of the present disclosure shall be in the scope of the claims of the present disclosure.

What is claimed is:

1. A method of controlling a pressure in a process chamber of a semiconductor heat treatment device, comprising:
   obtaining an actual pressure value in the process chamber;
   determining a first valve opening value for controlling opening of an exhaust valve according to a difference between the actual pressure value and a preset target pressure value;
   determining a first valve opening change value according to the first valve opening value and a current valve opening value;
   determining whether the first valve opening change value is within a preset fluctuation range of a valve opening change value corresponding to a current process stage; and
   in response to the first valve opening change value being within the fluctuation range, adjusting the opening of the exhaust valve according to the first valve opening value.

2. The control method according to claim 1, further comprising:
   in response to the first valve opening change value being outside the fluctuation range, obtaining the actual pressure value in the process chamber again;
   determining a second valve opening value for controlling the opening of the exhaust valve according to a difference between the obtained again actual pressure value and the preset target pressure value;
   determining a second valve opening change value according to the second valve opening value and the current valve opening value;
   determining whether the second valve opening change value is withing the fluctuation range; and
   in response to the second valve opening change value being outside the fluctuation range, adjusting the opening of the exhaust valve according to the second valve opening value.

3. The control method according to claim 2, further comprising:
   in response to the second valve opening change value being within the fluctuation range, abandoning the second valve opening value and returning to obtaining the actual pressure value on the process chamber.

4. The control method according to claim 2, further comprising:
   in response to the first valve opening change value being outside the fluctuation range, after waiting for a preset time period, obtaining again the actual pressure value in the process chamber.

5. The control method according to claim 4, further comprising:
   the preset time period is shorter than a delay time of a pressure alarm of the semiconductor heat treatment device.

6. The control method according to claim 1, wherein:
   the number of process stages is multiple, multiple fluctuation ranges are preset according to each process stage, and each fluctuation range corresponds to each process stage in a one-to-one correspondence.

7. A semiconductor heat treatment device, comprising a process chamber, an exhaust valve, a pressure sensor, and a control unit, wherein:
   the exhaust valve is disposed at an exhaust pipeline in the process chamber;
   the pressure sensor is configured to obtain an actual pressure value in the process chamber; and
   the control unit is configured to determine a first valve opening value for controlling opening of an exhaust valve according to a difference between the actual pressure value and a preset target pressure value; determine a first valve opening change value according to the first valve opening value and a current valve opening value; determine whether the first valve opening change value is within a preset fluctuation range of a valve opening change value corresponding to a current process stage; and in response to the first valve opening change value being within the fluctuation range, adjust the opening of the exhaust valve according to the first valve opening value.

8. The semiconductor heat treatment device according to claim 7, wherein:
   the control unit includes a first controller and a second controller;
   the first controller is used to determine the first valve opening value for controlling the opening of the exhaust valve according to the difference between the actual pressure value and the preset target pressure value; and
   the second controller is used to determine the first valve opening change value according to the first valve opening value and the current valve opening value, determine whether the first valve opening change value is within the preset fluctuation range of the valve opening change value corresponding to the current process stage, and in response to the first valve opening change value being within the fluctuation range, adjust the opening of the exhaust valve according to the first valve opening value.

9. The semiconductor heat treatment device according to claim 8, wherein:
   the first controller is also used to obtain the actual pressure value in the process chamber obtained by the pressure sensor again when the first valve opening change value is outside the fluctuation range, and determine a second valve opening value for controlling the opening of the exhaust valve according to the difference between the actual pressure value obtained again and the preset target pressure value; and
   the second controller is also configured to determine a second valve opening change value based on the second valve opening value and the current valve opening value, determine whether the second valve opening change value is within the fluctuation range, and in response to the second valve opening change value being outside the fluctuation range, adjust the opening of the exhaust valve according to the second valve opening value.

10. The semiconductor heat treatment device according to claim 9, wherein:
    the second controller is also used to abandon the second valve opening value in response to the second valve opening change value being outside the fluctuation range; and
    the first controller is also used to reobtain the actual pressure value in the process chamber obtained by the pressure sensor after the second controller abandons the second valve opening value.

* * * * *